United States Patent [19]

Zejda

[11] Patent Number: 5,205,919
[45] Date of Patent: Apr. 27, 1993

[54] CATHODE SPUTTERING APPARATUS

[75] Inventor: Jaroslav Zejda, Rodenbach, Fed. Rep. of Germany

[73] Assignee: Leybold Aktiengesellschaft, Hanau, Fed. Rep. of Germany

[21] Appl. No.: 731,857

[22] Filed: Jun. 20, 1991

[30] Foreign Application Priority Data

Mar. 30, 1991 [DE] Fed. Rep. of Germany ........ 4110490

[51] Int. Cl.$^5$ .................... C23C 14/56; C23C 14/50
[52] U.S. Cl. .................... 204/298.25; 204/298.15; 118/730
[58] Field of Search .............. 204/298.15, 298.25; 118/730; 414/217, 221; 198/470.1, 803.7, 803.8

[56] References Cited

U.S. PATENT DOCUMENTS 4,548,699 10/1985 Hutchinson et al. .......... 204/298.25
4,675,096 6/1987 Tateishi et al. ............. 204/298.25
4,943,363 7/1990 Zejda et al. ............... 204/298.15

FOREIGN PATENT DOCUMENTS

3912297A1 10/1990 Fed. Rep. of Germany ...................... 204/298.25

Primary Examiner—Aaron Weisstuch
Attorney, Agent, or Firm—Felfe & Lynch

[57] ABSTRACT

A cathode sputtering apparatus for the coating of substrates in a vacuum chamber is presented which accommodates a rotating substrate carrier, and which comprises at least one gripper which includes a hub and at least one arm with a gripper with the hub rotating around a horizontal axis; during the sputtering, two annular closing elements separate a segment in front of the station from the remaining portion of the vacuum chamber and a cathode vacuum chamber is thus formed which is separate from the vacuum chamber of the apparatus.

15 Claims, 4 Drawing Sheets

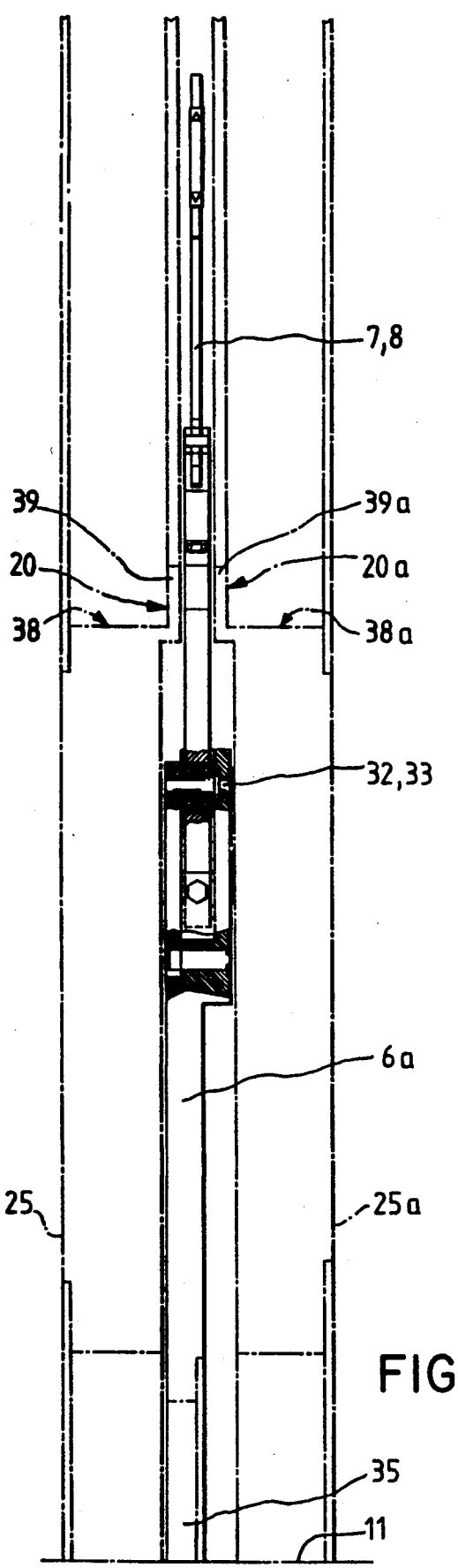
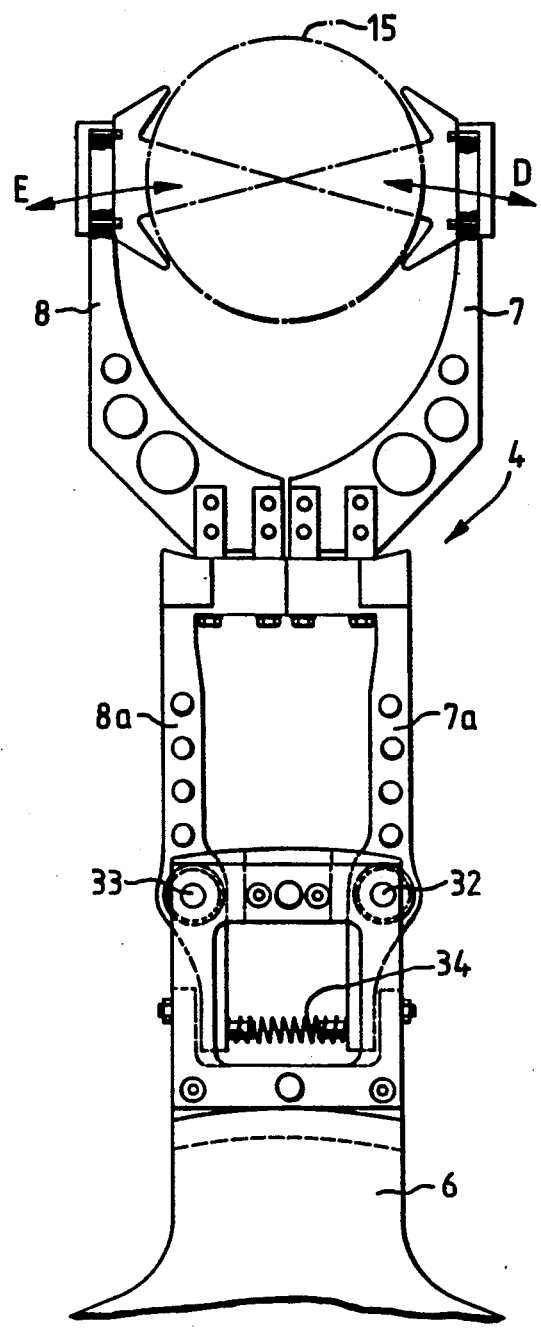
FIG. 5
FIG. 4

CATHODE SPUTTERING APPARATUS

FIELD OF THE INVENTION

The present invention relates to a cathode sputtering apparatus for coating substrates in a vacuum chamber which accommodates a rotating substrate carrier. The apparatus comprises at least a cathode station, a feeding station, and a discharge station.

BACKGROUND OF THE INVENTION

In the field of vacuum technology, especially thin layer technology, the coating of substrates, for example, compact disks (CD) is known. Compact disks are a modern storage medium for digital information. In a sputtering process, the pressed plastic disks are coated with an aluminum layer, for example, which has a thickness of less than one ten-thousandth of a millimeter. The sputtering apparatuses used for this purpose have an annular configuration. A robot discharges the apparatus via a lock chamber in a clean room. From the lock, a substrate carrier transports the substrates across the annular process chamber. The sputtering is carried out by a high performance sputtering cathode which is designed as a magnetron.

An apparatus of this type is described, for example, in DE 39 12 295 by Leybold AG. This known cathode sputtering system is used for one-sided coating with a laser-reflecting aluminum layer. The apparatus comprises a cylindrical, vertically disposed vacuum chamber with a feeding and discharging station, a high performance sputtering cathode, a transport ring for receiving disks, and dynamic locks for pressure separation between the coating chamber and the feeding/discharging station.

SUMMARY OF THE INVENTION

The present invention provides a process and vacuum chambers with more cathode stations, measuring stations and stations of other functions, such as feeding and discharging the apparatus, than are known in prior art apparatuses. More particularly, the apparatus is suitable for the simultaneous coating of both sides of a discoidal substrate. Moreover, the present inventive apparatus has a long service life and a high operating speed, and during sputtering operation, there is a good, reliable separation of the cathode chamber from the remaining vacuum chamber(s) of the apparatus.

The aforesaid advantages are accomplished in accordance with the present inventive apparatus, wherein the substrate carrier includes at least one plate or a pair of grippers interacting with two annular closing elements of a lock valve. The latter hermetically separates the portion in front of the station from the remaining portion of the vacuum chamber.

Additional details of the invention will be understood from the following detailed description of preferred embodiments which is explained with reference to FIGS. 1-5.

BRIEF DESCRIPTION OF THE DRAWINGS

FIGS. 4 and 5 are enlarged views of the grippers shown in FIG. 3.

DETAILED DESCRIPTION OF PREFERRED EMBODIMENTS

Figure 1:
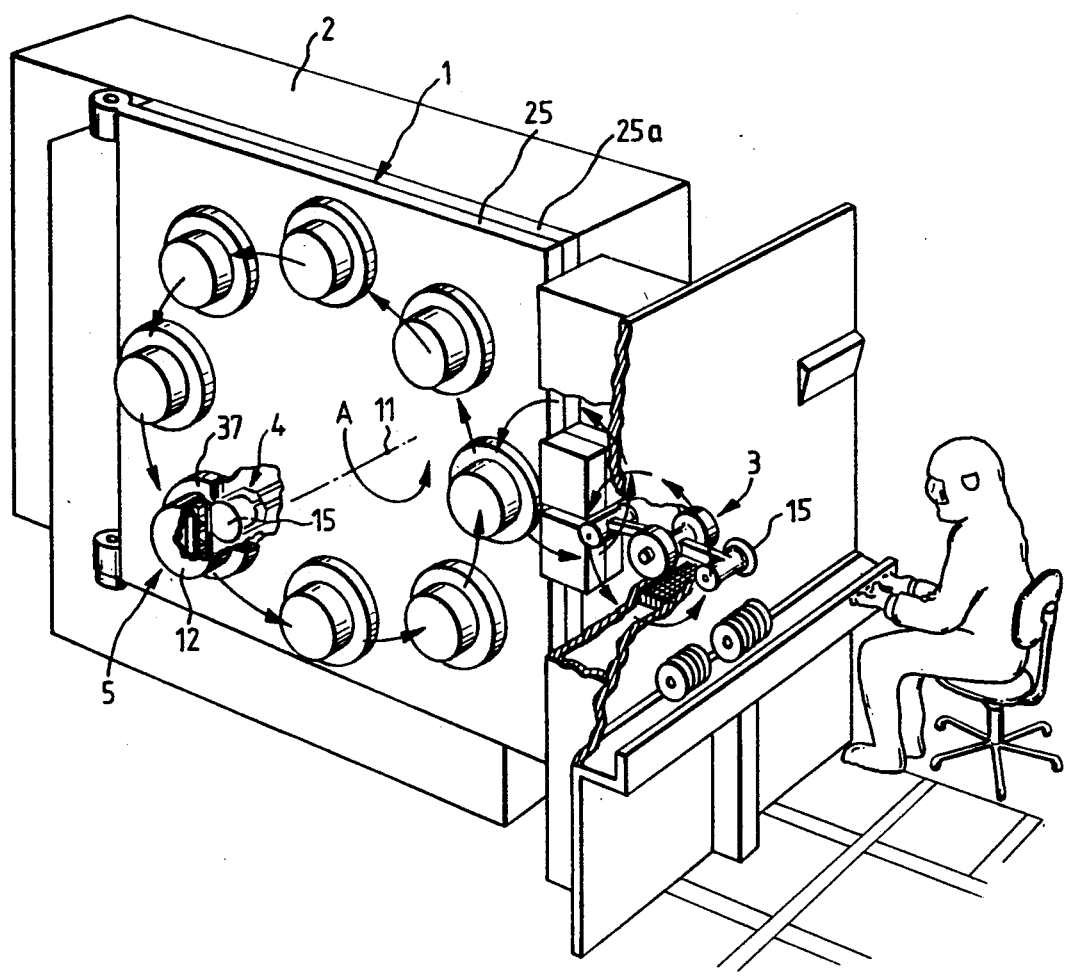
FIG. 1 is an axonometric representation of an embodiment of the cathode sputtering apparatus in accordance with the invention.

FIG. 1 shows a Circular disk-like configuration of the vacuum chamber referenced as 1. It comprises a cover 25 and chamber part 25a. The vacuum chamber is held by a frame or support 2. Numeral 3 refers to the feeding and discharge station. Numeral 5 designates a open cathode station. This cathode station is described in greater detail in FIG. 2.

Figure 3:
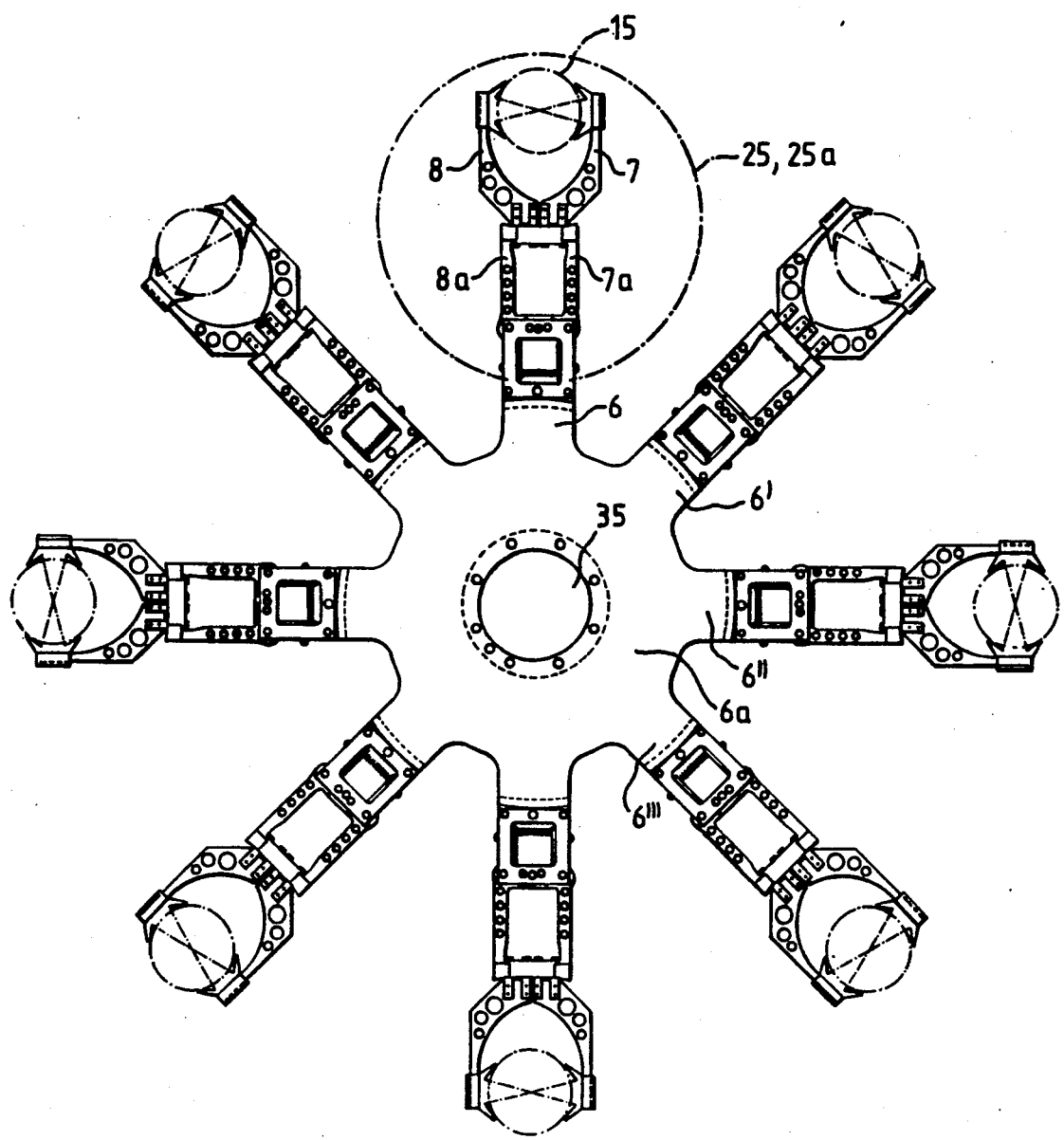
FIG. 3 is a top view of the substrate carrier including a total of eight pairs of grippers.

In FIG. 1, the vacuum chamber 1 is partially open so that a pair of grippers 4 is visible. As can be seen in FIG. 3, each of this pair of grippers includes an arm 6 and two jaws 7, 8 with two-armed levers 7a, 8a. Arm 6 is disposed at a central hub 6a. A driving element rotates this hub 6a in a step-wise manner by a certain angle from station to station in the direction of arrow A. As seen in FIG. 1, the driving device is disposed centrally with respect to vacuum chamber 1. Numeral 11 designates the central axis of vacuum chamber 1.

Figure 2:
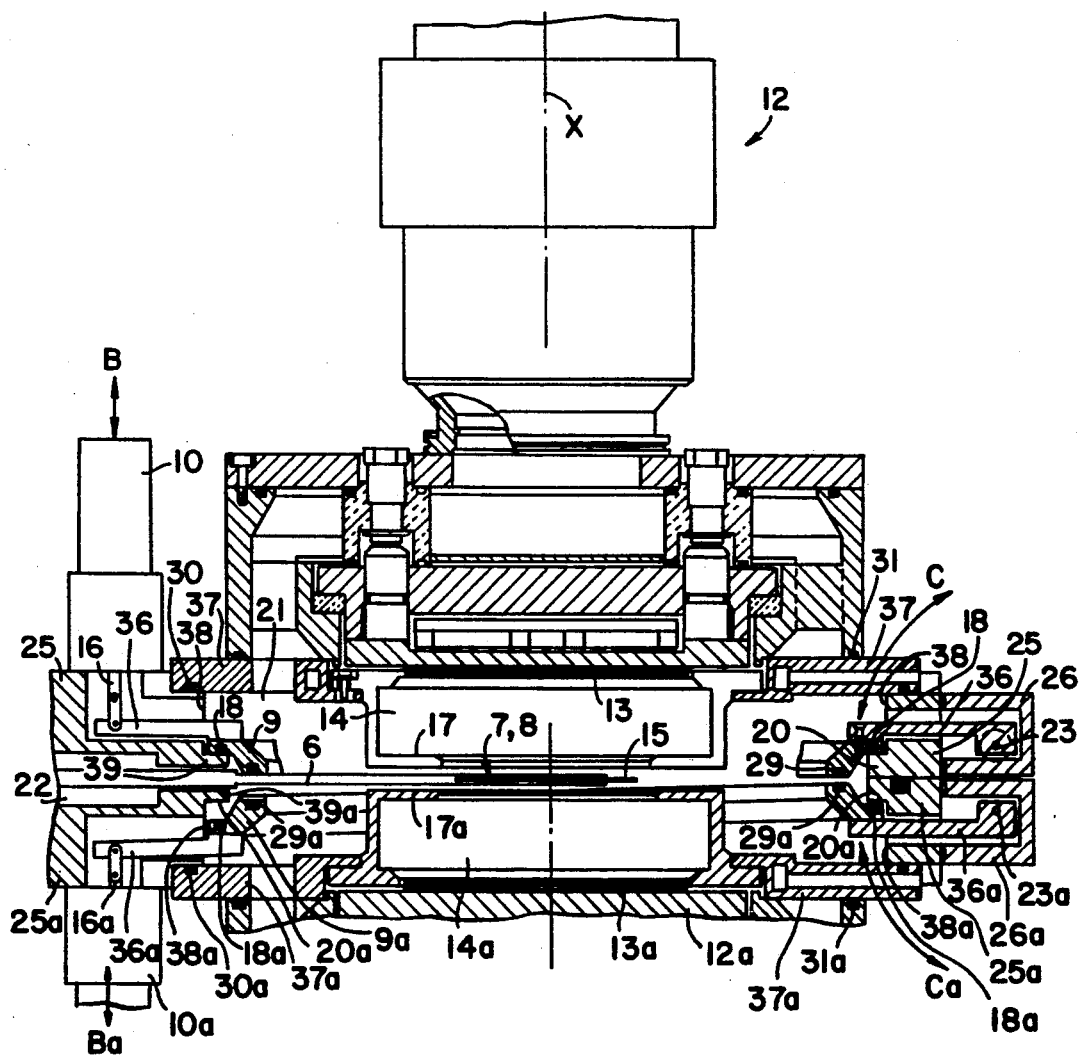
FIG. 2 is a sectional view of a part of the sputtering cathode including the coating chamber of the apparatus according to FIG. 1.

FIG. 1 shows several cathode stations and several measuring stations for monitoring the operation of the apparatus. FIG. 2 shows details of two opposite cathode stations. The opposed cathode stations are referenced as 12 and 12a. The targets are referenced as 13 and 13a. Each FIG. shows a high performance cathode (magnetron cathode).

During operation of the cathode, a plasma is generated in areas 14, 14a in front of respective cathodes 12 and 12a. This plasma is condensed by the magnetic field of the respective magnetron cathode. Positively charged ions emerging from the plasma bombard the target. Particles of material are sputtered out of the target. The sputtering material reaches the substrate which, in FIGS. 1 and 2, bears reference numeral 15. Masks 17, 17a are disposed between cathodes 12, 12a, on the one hand, and substrate 15 and jaws 7, 8, on the other hand, respectively.

During the sputtering process, hydraulic pistons 10, 10a, via piston rods 16, 16a, press the two annular closing elements 9, 9a, against each other in the direction of arrow B, Ba. These closing elements are rotatably disposed at stationary pins 23, 23a by means of strap hinges 36, 36a. The seals 18, 18a of these piston rods urge against the chamber walls and their annular sealing surface 20, 20a of vacuum chamber halves 35, 35a, thus sealing chamber 21 with respect to chamber 22.

In this situation, the sputtering material is concentrated on substrate 15. On the other hand, sputtering of jaws 7, 8 and other parts of gripper 6 is avoided. The shape of masks 17, 17a shields the jaws 7, 8 and other parts of the grippers 6 while the resulting uniformity of the layers is good. The two closing elements 9, 9a are supported at the halves of the vacuum chamber walls where they can be rotated in the direction of arrows C, Ca around the stationary pins 23, 23a similar to the movement of a waffle iron. These closing elements 9, 9a can be represented in different positions as follows: element 9 is in the "CLOSED" position whereas element 9a is rotated into the "OPEN" position (this situation illustrates the function only, and it is not intended in the actual operation of the cathode sputtering apparatus.)

During the sputtering, the flanges 37 and 37a of cathode stations 12, 12a, the cathodes themselves, the masks 17, 17a, the two halves 25, 25a of vacuum chamber 1, and the closing elements 9, 9a form an insulated chamber that is separate from the remaining vacuum chamber 22 of the cathode sputtering apparatus. Numerals 26 and 26a refer to caps which are rigidly attached to the small side of vacuum chamber 1, radially on the outside, and the two halves 25, 25a of the chamber. These caps serve to hold and seal the closing elements 9, 9a. Numerals 29, 29a, 30, 30a, 31, 31a designate O-rings which seal off the vacuum chamber 21 of the cathode.

FIG. 3 shows the hub 6a with a plurality of grippers 6, 6', of the sputtering apparatus firmly attached to the hub.

As best seen in FIG. 4, each gripper is composed of an arm 6, a pair of two-armed levers 7a, 8a which rotate in the directions D and E around the pins 32, 33, each against the force of a spring 34. The motor drive for opening and closing the gripper 6 is for clarity's sake not represented in greater detail.

As seen in FIG. 1, numeral 11 designates the axis around which the hub 6a with the grippers 4 rotates in a pulsed movement, i.e., it operates in steps as seen in FIG. 2, and a central shaft 35 is the driving element. The movement and the pulsing by a certain angle is generated with great accuracy by means of a precision indexing table such as is used, for example, in tool manufacturing.

A gripper, in step-wise operation, transports the substrate 15 from the lock station and/or feeding station 3 to cathode stations 12, 12a of the apparatus.

The invention ensures a positive separation between the cathode vacuum chambers 21 and the remaining vacuum chamber 22 of the apparatus. Substrate 15 can be coated either on one side or on both sides. For a one-sided coating, a station has a cathode 12, or 12a, disposed at half 25 or half 25a of the vacuum chamber.

As seen in FIG. 2, the two closing elements 9, 9a (the pair of closing elements) are shaped as rings. Their external diameter corresponds exactly to the internal diameter of the circular cylindrical openings 38, 38a in the two halves 25, 25a of the vacuum chamber. Each of the two closing elements has two sealing elements 18, 18a and 29 and 29a, respectively. The one sealing ring 29, 29a thereof which is radially on the inside sealingly urges against arm 6 and hub 6a (in the "CLOSED" position). In the area of their caps, the sealing rings 29, 29a directly rest on one another.

In the "CLOSED" position, the one sealing ring 18, 18a which is radially disposed on the outside comes to rest on the annular protrusion 39 and 39a which is configured as one piece with the halves 25, 25a of the vacuum chamber (cover 25 and chamber 25a). In the "OPEN" position both closing elements 9, 9a are positioned at a flat angle to each other so that the substrate holder and the arms 6, 6', can be further rotated. It is clear that the space between the two pins 23, 23a remains the same. These pins must hence be disposed or supported in the vacuum chamber 1 in a stationary manner.

I claim:

1. Cathode sputtering apparatus for coating substrates in a vacuum chamber which accommodates a rotating substrate carrier including a central hub, comprising at least one cathode sputtering station and at least one feeding and discharge station, wherein the substrate carrier further comprises at least one substrate gripper which interacts with a pair of annular closing elements of a lock valve which serves to separate the sputtering space in front of at least one cathode sputtering station from the remaining segment of the vacuum chamber.

2. Cathode sputtering apparatus in accordance with claim 1, wherein each gripper is adapted to grip a substrate which is moved to the cathode sputtering station from the feeding and discharge station.

3. Cathode sputtering apparatus in accordance with claim 2, wherein each gripper has two diametrically opposed jaws which are rotatably disposed on an arm wherein the arm is configured and disposed such that the jaws with respect to the interacting parts of the apparatus including the sputtering cathode, the feeding station, and the discharge station, are always in a parallel alignment with these parts while in motion.

4. Cathode sputtering apparatus in accordance with claim 3, wherein the arm is configured so as to be rigid, and rotates around a central axis.

5. Cathode sputtering apparatus in accordance with claim 3, wherein the arm has a guiding system comprising two adjacent arm elements the free ends of which have the jaws.

6. Cathode sputtering apparatus in accordance with claim 3, wherein a mask is adapted to be disposed between at least one sputtering cathode and the substrate.

7. Cathode sputtering apparatus in accordance with claim 6, wherein the elements of at least one sputtering cathode station, including the mask, a chamber wall, a cover, the arm, and the closing elements form a vacuum chamber which can be vacuum-tight separated from the remaining segment of the vacuum chamber of the cathode sputtering apparatus.

8. Cathode sputtering apparatus in accordance with claim 1, wherein a driving device is provided for at least one gripper which is centrally disposed with respect to the cathode sputtering apparatus and which step-wise moves at least one gripper by an angle in the vacuum chamber of the cathode sputtering apparatus.

9. Cathode sputtering apparatus in accordance with claim 1, wherein the vacuum chamber of the cathode sputtering apparatus is vertically disposed, and at least one gripper rotates around a horizontally disposed central axis.

10. Cathode sputtering apparatus in accordance with claim 9, wherein each pair of interacting closing elements has a substantially annular configuration wherein those edges that are radially on the outside are joined, via articulated levers or strap hinges so that the closing elements can be rotated by axes running transversely to the horizontal axis of rotation, and wherein the rotating movement is generated via piston rods disposed on said articulated levers or strap hinges opposite the edge of the closing elements.

11. Cathode sputtering apparatus in accordance with claim 10, wherein on their front surfaces which face one another, each of the pair of closing elements has a first sealing ring interacting when the closing elements, assume a position that is perpendicular to the axis of rotation and together with a second pair of sealing rings provided at the closing elements, such that they enclose a substantially circular cylindrical vacuum chamber.

12. Cathode sputtering apparatus in accordance with claim 11, wherein the vacuum chamber comprises two halves and wherein each of the halves comprising said vacuum chamber has a circular cylindrical opening for each feeding and discharge station, wherein this opening can be closed from the outside by sputtering cathode flanges or by lock plates, wherein in the area of the openings in the plane of the contacting surfaces of said vacuum chambers said halves have annular protrusions extending into said opening, and wherein these protrusions having sealing surfaces that interact with the sealing rings of the closing elements.

13. Cathode sputtering apparatus in accordance with claim 12, wherein each closing element has a sealing ring which interacts with the hub and which, when in a closed position, sealingly urges against the corresponding surface of the hub and is lifted off this surface when in an open position.

14. Cathode sputtering apparatus in accordance with claim 13, wherein at its side facing away from the axis of rotation, each closing element has a lever or a hinge strap which is rotatably supported on a pin that is part of a half portion of the vacuum chamber or is directly mounted to a half portion, of the vacuum chamber.

15. Cathode sputtering apparatus in accordance with claim 14, wherein opposite the strap hinge, a lever is rigidly disposed at the closing element wherein said lever interacts with a tension rod or an actuating rod or element with the direction of the action running approximately perpendicular to the surface of hub of the gripper.

* * * * *

UNITED STATES PATENT AND TRADEMARK OFFICE
CERTIFICATE OF CORRECTION

PATENT NO. : 5,205,919
DATED     : April 27, 1993
INVENTOR(S) : Jaroslay Zejda

It is certified that error appears in the above-indentified patent and that said Letters Patent is hereby corrected as shown below:

Title page, item [75], inventor: should read-- Jaroslay Zejda--.

Signed and Sealed this

Nineteenth Day of July, 1994

Attest:

BRUCE LEHMAN

*Attesting Officer*     *Commissioner of Patents and Trademarks*